United States Patent [19]

Campbell et al.

[11] Patent Number: 5,122,251

[45] Date of Patent: Jun. 16, 1992

[54] HIGH DENSITY PLASMA DEPOSITION AND ETCHING APPARATUS

[75] Inventors: Gregor A. Campbell, Glendale; Robert W. Conn; David C. Pearson, both of Los Angeles; Alexis P. deChambrier, Burbank, all of Calif.; Tatsuo Shoji, Nagoya, Japan

[73] Assignee: Plasma & Materials Technologies, Inc., Burbank, Calif.

[21] Appl. No.: 650,788

[22] Filed: Feb. 4, 1991

Related U.S. Application Data

[63] Continuation-in-part of Ser. No. 365,533, Jun. 13, 1989, Pat. No. 4,990,229.

[51] Int. Cl.⁵ .................. H05H 1/46; C23C 14/34; B01J 19/12
[52] U.S. Cl. .................. 204/298.06; 118/723; 156/345; 315/111.41; 204/298.16; 204/298.31; 204/298.34; 204/298.37; 204/298.07; 204/298.33; 422/186.05
[58] Field of Search ........ 204/298.06, 298.07, 204/298.16, 298.31, 298.33, 298.34, 298.37; 156/345; 118/723; 315/111.41; 422/186.05

[56] References Cited

U.S. PATENT DOCUMENTS

| | | | |
|---|---|---|---|
| 4,810,935 | 3/1989 | Boswell | 315/111.41 |
| 4,844,775 | 7/1989 | Keeble | 156/643 |
| 4,859,908 | 8/1989 | Yoshida et al. | 315/111.81 |
| 4,948,458 | 8/1990 | Ogle | 156/643 |
| 4,948,750 | 8/1990 | Kausche et al. | 437/101 |
| 4,990,229 | 2/1991 | Campbell et al. | 204/298.06 |
| 5,032,202 | 7/1991 | Tsai et al. | 156/345 |

Primary Examiner—Aaron Weisstuch
Attorney, Agent, or Firm—Merchant, Gould, Smith, Edell, Welter & Schmidt

[57] ABSTRACT

A high density ionized plasma is generated in a source chamber using a single loop disposed in a plane that intercepts the central axis of the source chamber perpendicularly or at a lesser angle and spaced from the closed end of the chamber. With a longitudinal magnetic field and an inert or reactive gas injected into the source chamber, excitation of the antenna with RF energy in the 5 to 30 MHz establishes the $M=0$ excitation mode or components of both the $M=0$ and $M=1$ modes. Low frequency whistler waves are created which generate a uniform and high density plasma and high plasma current. The plasma source thus defined is used in combination with process chamber configurations in which static shaped or time modulated magnetic fields enhance the distribution and uniformity of the plasma at a substrate to be etched, deposited or sputtered.

34 Claims, 9 Drawing Sheets

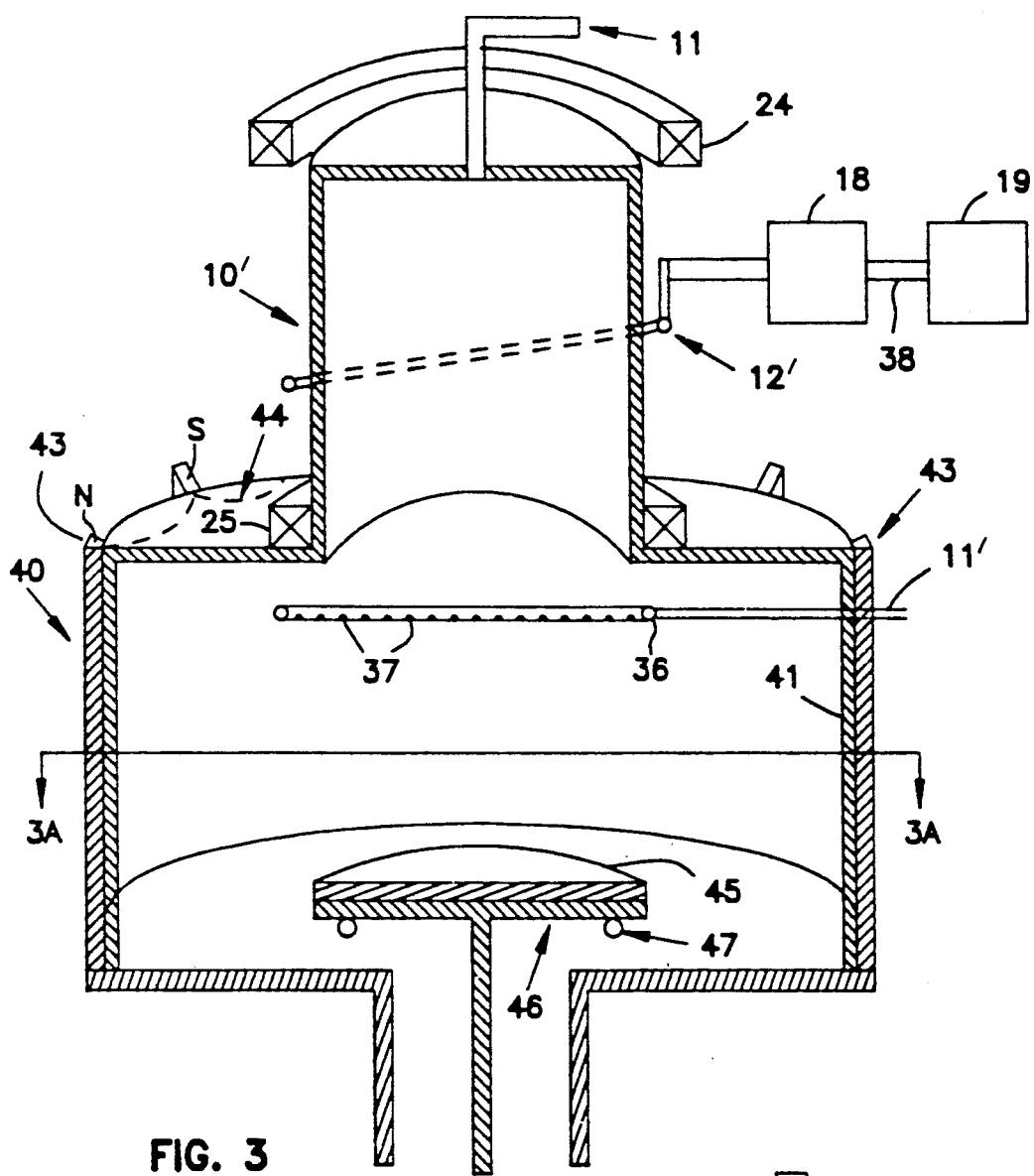
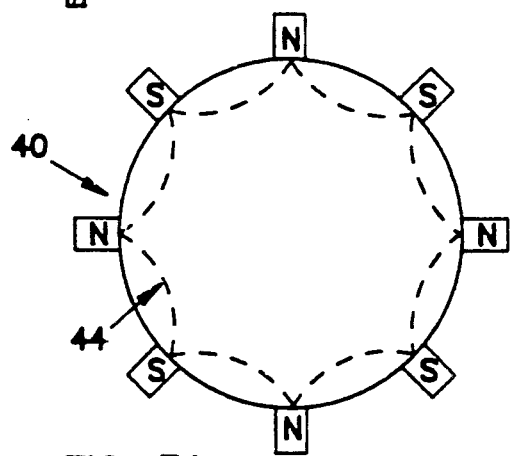
FIG. 3
FIG. 3A

HIGH DENSITY PLASMA DEPOSITION AND ETCHING APPARATUS

CROSS-REFERENCE TO RELATED APPLICATION

This application is a continuation-in-part of U.S. patent application Ser. No. 07/365,533, filed Jun. 13, 1989 and issued Feb. 5, 1991 as U.S. Pat. No. 4,990,229, which is hereby incorporated by reference.

BACKGROUND OF THE INVENTION

1. Field of the Invention

The present invention relates to a plasma deposition or etching method and various apparatus for depositing a thin film onto a substrate or for removal (etching) of a film from a substrate.

2. Description of Related Technology

Etching

Plasma etching involves using chemically active atoms or energetic ions to remove material from a substrate. It is a key technology in the fabrication of semiconductor integrated circuits. However, before the advent of microwave plasmas utilizing electron cyclotron resonance (ECR) it was becoming difficult for conventional plasma etching techniques to satisfy the requirements dictated by the increase in device packing density. Specifically, the requirement for fine pattern etching without undercutting (anisotropic etching) and the requirements for low damage and high selectivity could hardly be satisfied at the same time.

Deposition

Plasma Enhanced Chemical Vapor Deposition is a widely used technique to deposit materials on substrates in a host of applications. In normal CVD the chemical reaction is driven by the temperature of the substrate and for most reactions is high ($>800°$ C). The high substrate temperature needed precludes use of this method in a number of applications particularly in microelectronics, displays and optical coatings. The role of the plasma is to dissociate and activate the chemical gas so that the substrate temperature can be reduced. The rate of dissociation, activation and ionization is proportional to the density of the plasma. It is therefore of importance to make the plasma as dense as possible.

Sputtering

Sputtering is also a widely used method for depositing materials onto substrates for a wide variety of applications such as the production of hard or decorative coatings and the coating of glass. In general, a plasma is produced at the sputter target material and the sputter target is biased to a negative voltage of around 700 V. Plasma ions, generally argon, impact the surface and sputter the material which then transports as neutral atoms to a substrate. Reactive gases can be introduced to chemically react with the sputtered atoms at the host substrate in a process called reactive sputter deposition. Rate is often important and it is therefore important to make the plasma as dense as possible. Ionization of reactive gases is also important and is helped by having plasma in the vicinity of the substrate material. Sputtering is also done by ions accelerated in an ion or plasma gun and then made to bombard the sputter target. In this case, a bias voltage on the target is not necessary. For sputtering insulating materials, RF voltage bias can be applied to the sputter target.

Existing Methods

There are presently two widely used methods for plasma deposition and etching, the parallel plate reactor and the ECR plasma deposition system.

Parallel Plate Reactor (Diode)

The RF diode has been widely used for both deposition and etching. It is described in detail in the book by Chapman ("Glow Discharge Processes" John Wiley & Sons 1980). It uses RF at 13.56 MHz capacitively coupled to one electrode while the other electrode is grounded. The pressure in the system is typically 1 mtorr-1 torr and the plasma density is typically $10^{10}$ electrons per cc. The rate at which both deposition or etching occurs is dependent on the density of the plasma and the density (pressure) of the reactive gas used to etch, or in CVD processes to deposit.

In etching, the high pressure needed to sustain the discharge causes collisions between the ions and the background gas. This causes the paths of the etching ions or atoms to become randomized or non-directional, leading to undercutting of the mask. This is referred to as an isotropic etch. It is desirable to have the etch atoms or ions be directional so that straight anisotropic etches can be achieved. At the high pressure used in RF diode discharges it is necessary for the ions to have high energy (greater than several hundred eV) to achieve an anisotropic etch. However, the high energy of the ions can cause damage to the substrate, film materials or photoresist.

The plasma is sustained by secondary electrons that are emitted by ions impacting the cathode. These electrons are accelerated by the voltage drop across the sheath which is typically 400-1000 V. These fast electrons can bombard the substrate, causing it to have a high voltage sheath drop. This high voltage can accelerate the ions leading to damage of the substrate or film material. The presence of high energy electrons leading to high voltage sheath drops is undesirable.

Electron Cyclotron Resonance Plasmas

The advent of using microwaves at 2.45 GHz and a magnetic field of 875 gauss to utilize electron cyclotron resonance allowed the generation of high density plasmas at low pressure. The advantages of this technique for plasma etching are described by Suzuki in an article entitled "Microwave Plasma Etching" published in Vacuum 34 No. 10/11 1984. Due to a low gas pressure 0.04-0.4 Pa) and high plasma density ($1.7-7 \times 10^{11}$ electrons/cm$^3$) anisotropic etch with high etch rates is achievable.

Suzuki, in U.S. Pat. No. 4,101,411, describes a plasma etching apparatus using ECR; Matsuo, in U.S. Pat. No. 4,401,054 describes a plasma deposition apparatus utilizing ECR.

While this technique is desirable over the parallel plate reactor in many respects, it has several limitations. The magnetic field needed is very high (1-2 kG) which means that heavy, power consuming electromagnets must be used. The maximum density is limited by either cut-off in certain configurations or by refraction in other configurations to the value of $1 \times 10^{12}$ electrons/cm$^3$. The expense of the power supply and necessary hardware to generate and transmit the microwaves is high. The uniformity (or width of the plasma profile) is not very good.

SUMMARY OF THE INVENTION

The present invention utilizes low frequency RF whistler waves to generate plasmas of high density for use in plasma etching, deposition, and sputtering equipment. In conjunction with a source tube into which a gas is injected and along the central axis of which a magnetic field is established, a single loop antenna is disposed in a plane transverse to the central axis. The angle of the antenna plane is 90° if it is desired to excite only M=0 mode, or at less than 90° if it is desired to excite components in both M=0 and M=1 mode. The gas is a noble or reactive gas and at a pressure of 0.1 mtorr to 200 mtorr. The magnetic field strength is in the range of 10 to 1000 gauss and the antenna is driven with RF energy of 100 W to 5 KW at a frequency range of 2 MHz to 50 MHz. With the antenna placed along the tube source at a sufficient distance along the axis from the gas injection end, the other end defining an open egress zone leading to a process chamber, the single loop antenna surprisingly provides highly efficient wave coupling to establish a high density and high current plasma.

In accordance with other features of the invention the plasma generated by this plasma source is supplied to a process chamber including a magnetic bucket system for holding the plasma away from the process chamber walls. The arrangement provides, in combination, a uniform plasma density over a large circular area, so that a large substrate may be etched or otherwise processed. Another feature is that a magnetic cusp zone may be established, at the material surface being processed, to homogenize and make more uniform the plasma at that location. An aspect of this is that the magnetic cusp position relative to the substrate may be time modulated to enhance uniformity and reduce sensitivity to substrate location.

Further, the magnetic field may be expanded to allow deposition or etching over a large area and current flows may be equalized by serial driving of antennas in systems having more than one antenna. Other features reside in configurations which employ one or more multiple geometrical areas for coating or etching of square or rectangular substrates, or a linear juxtaposition for coating or etching large substrates.

BRIEF DESCRIPTION OF THE DRAWINGS

FIG. 3 is a schematic diagram of a second example of a system in accordance with the present invention in which the plasma source region is connected to a magnetic bucket region where uniformity requirements are important;

FIG. 3A is a plan view of the arrangement of FIG. 3, taken along the line 3A—3A in FIG. 3;

DETAILED DESCRIPTION OF THE INVENTION

Figure 1:
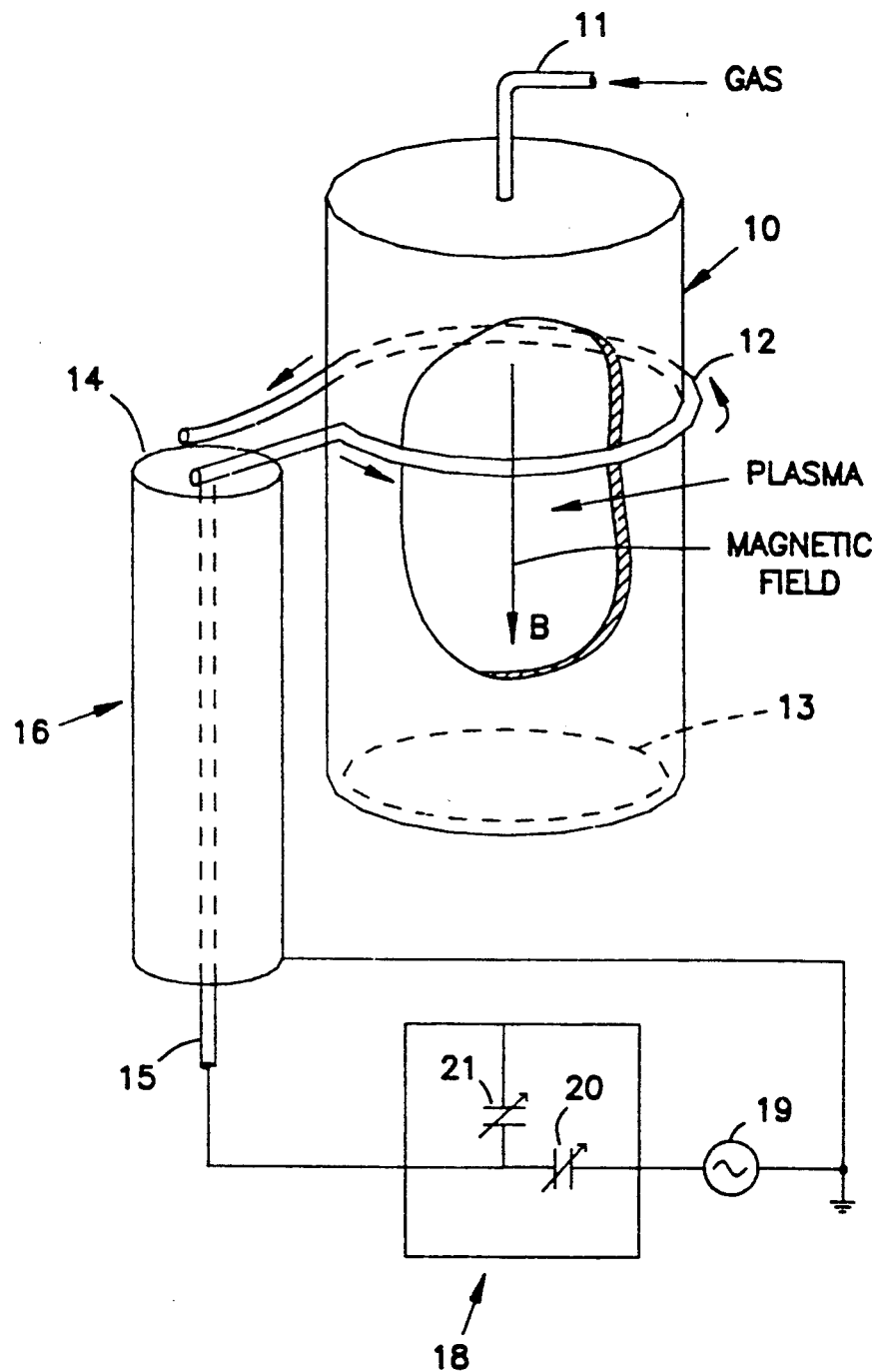
FIG. 1 is a schematic diagram depicting the principle of operation and RF current flow in a plasma source constructed according to the present invention.

A simplified view of principal elements and relationships in a device in accordance with the invention is provided by the representation of FIG. 1, wherein high density plasma is to be generated within a source tube 10 of generally cylindrical form about a central (here vertical) axis. At one (here upper) end an injector 11 feeds gas to be ionized into the interior volume of the source tube, where the gas is excited by an external loop antenna 12 that encompasses an intermediate region of the source tube 10. The antenna loop 12 comprises in this example a not fully circular element lying in a plane that is at 90° or less in either sense relative to the central axis. The direction of propagation of the plasma is here downward toward an exit aperture 13. The antenna loop 12 has its opposite ends coupled to the outer conductor 14 and center conductor 15 of a coaxial driver line 16 which is energized through a matching box 18 by an RF energy source 19. A pair of variable vacuum capacitors 20, 21 in the matching box 18 are adjustable to tune the circuit so that the antenna loading plus the reactive load of the matching box 18 is approximately 50 ohms to minimize the reflected power.

The antenna tuning and wave spectrum are adjusted to match the conditions in the plasma field, and also in relation to an interior axial magnetic field generated by at least one magnetic field coil (not shown) about the source tube 10. The matching condition is predicted by theory to be dictated by the dispersion relation:

$$[\omega/\omega_c - \omega_p^2/C^2 k_z^2]^2 = 1 + (3.83/k_z a)^2$$

To effect wave coupling and establish a high plasma current density, measured in mA/cm$^2$, the antenna loop 12 is driven at 13.56 MHz and with RF energy of the order of 2.0 KW (in the range of 100 W to 5 KW) by the RF energy source 19. The magnetic field established by the coil is in the range of 10 to 1000 gauss, for different useful applications. The gas is argon and maintained at a pressure of about 1 mtorr in this example. However, in addition to a noble gas such as argon, reactive gases such as $SF_6$, chlorine, oxygen, and mixtures with oxygen have been used with comparably useful results. A pressure range of 0.1 mtorr to 200 mtorr can be used if other variables are properly taken into account. With a 5 KW power supply less than the maximum available power can be used, to a substantially lower level of several hundred watts, depending on the application. Although the 13.56 MHz frequency is available from many industrial sources, the range of 2 MHz to 50 MHz can be usefully employed.

In FIG. 1, the antenna loop 12 is shown at 90° to the longitudinal axis of the source tube 10. This orientation generates the M=0 mode, while reducing the angle from 90° in either sense introduces components of the M=1 mode as well as components of the M=0 mode. Angles of less than 90° to the longitudinal axis require correspondingly longer antenna loops 12, so there is a practical limit of about 45° to the angle which can be used. Most orientations are preferred to be in the range of 60° to 90°. It should be noted that the loop 12 is disposed within a flat plane that is directly perpendicular or tilted to the longitudinal axis. In the prior art constructions with double loops and other configurations it has usually been postulated that the looped portions must describe a helical path in order to establish a helical wave property, but this is disproven by the results given below as to the efficacy of the present invention. It is important, however, that the antenna loop 12 be sufficiently spaced apart from the closed (gas entry) end of the source tube 10 for the necessary interactions to occur between the plasma and the RF energy, and for the dispersion relation to be satisfied so that proper excitation can be realized and high density can be achieved. Too long a length, however, can also preclude establishment of the proper wave numbers. In practice, source tubes 10 of 1" to 4" in diameter and 8" to 9" in length have been used, with the antenna loop being about one-third or more of the distance from the closed end.

This arrangement establishes low frequency whistler waves, but the mechanism of the wave energy-plasma interaction is not fully understood. Simple analysis in accordance with the dispersion relation is not feasible. The presence of the plasma load in the RF field appears to give rise under proper conditions to selective interactions in which the gas density and dielectric characteristics determine the wave numbers that exist. In a sense, therefore, the plasma itself appears to predetermine the wavelengths for interaction, and thus the value of $k_z$, out of the spectrum of radiation from the antenna that excites the plasma.

The physics of whistler wave propagation in plasmas has been studied in other contexts. In a cylindrical geometry these waves are generally referred to as helicon waves. The classical helicon wave was first investigated by Lehame and Thonemann and is governed by the following equations:

$$\nabla \times \underline{E} = \delta \underline{B}/\delta t.$$

$$\nabla \times \underline{B} = \mu_0 \underline{j}.$$

$$\nabla \cdot \underline{B} = 0$$

$$\underline{E} = \underline{j} \times \underline{B}_0/en_0, \quad E_z = \eta J_z$$

where $\underline{E}$ is the electric field, $\underline{B}$ is the magnetic field, $\underline{j}$ is the current density, $\underline{B}_0$ is the vacuum magnetic field, e is the charge on an electron, $n_0$ is the density of the plasma and $\eta$ is the resistivity of the plasma.

Following the derivation of Chen one can easily find perturbations of the form $B \exp(i(m\theta + k_z - \omega t))$, and in the $\eta = 0$ limit the above equations lead to:

$$\nabla^2 \underline{B} + \alpha^2 \underline{B} = 0$$

where $$\alpha = (\omega/k)(\mu_0 e n_0/B)$$

where $$\underline{j} = (\alpha/\mu_0)\underline{B}$$

and $\omega$ is the angular frequency of the wave, $\mu_0$ is the permittivity, k is the wave number, $2\pi/\lambda$, where $\lambda$ is the wavelength. These equations can be solved in cylindrical coordinates to yield the dispersion relation:

$$m \, \alpha J_m(T a) + Tk\alpha J_m'(T a) = 0$$

where, $J_m$ is a Bessel function of the first kind, $J_m'$ is a derivative of $J_m$ with respect to its argument, a is the plasma radius and T is a transverse wave number defined by $$T^2 = \alpha^2 - k^2$$

It is important to remember that m is the mode number that describes the $\theta$ dependence of perturbations of the form $B \exp(i(m\theta + k_z - \omega))$.

The two lowest modes satisfy $$J_1(T a) = 0 \quad (m=0)$$

$$J_1(T a) = Tka/2\alpha(J_2 - J_0) \quad (m=1)$$

This leads to the simple relation $$[(\omega/\omega_c)(\omega_p^2/c^2 k_z^2)]^2 = 1 + (3.83/k_z a)^2$$

where $\omega_c$ = cyclotron angular frequency $\omega_p$ = plasma frequency for the m=0 mode. The above derivation is important understand the excitation of the desired mode by the antenna.

Another important mechanism to understand is the damping of the wave by the plasma. In the papers by Boswell, wave damping by electron collisions could not explain the experimentally observed results. Chen, however, determined that Landau damping was responsible for the large damping observed experimentally. Landau damping is a collisionless damping of waves in a plasma due to particles in the plasma that have a velocity nearly equal to the phase velocity of the wave. These particles travel with the wave, do not see a rapidly fluctuating electric field and so can effectively exchange energy with the wave. In a plasma there are electrons both faster and slower than the wave. In a Maxwellian distribution, however, there are more slow electrons than fast ones and so there are more particles taking energy from the wave than vice versa.

The damping rate due to Landau damping has been calculated by Chen for helicon waves and can be expressed as:

$$Damping\ Rate = Jm(k_z)/Re(k_z) 2\pi c^2 (3.8/a)^2 \xi^3 e^{-\xi^2}$$

where $\xi = \omega/k_z V_{th}$ and $V_{th}$ is the thermal velocity of the plasma electrons. It is of interest to demonstrate how sensitive the damping rate is to the value of k because it is such a steep function of $\xi$. Take for example a plasma with a density of $10^{12}$ electrons/cm$^3$, an electron temperature of 3 eV and a driving frequency of 8 MHz. The collisional damping rate would be 0.065 and the Landau damping rate would be 0.6 for $k_z = 0.25$ cm$^{-1}$ and 0.0005 for $k_z = 0.125$ cm$^{-1}$. It is clear that Landau damping is the important damping mechanism and that it is very dependent on the wave number $k_z$.

There are a number of factors important in devising an antenna structure which excites whistler waves for generation of plasmas, including a) frequency of excitation, b) wave mode and c) efficiency of coupling RF power to plasma. The frequency of the waves should be such that it satisfies $\Omega_c < \omega < \omega_c$ where $\Omega_c$ is the ion cyclotron frequency, e $B_0/M_i$ and $\omega_c$ is the electron cyclotron frequency e $B_0/M$. These waves are low frequency waves that operate far below the electron cyclotron frequency.

The mode structure of the wave electric and magnetic fields should be understood so that the antenna arrangement can efficiently couple the RF power into wave excitation. As discussed above the two lowest modes are the m=0 and m=1 modes. The mode structure of the wave electric field for an m=0 mode has radial and circumferential electric field vectors, spatially disposed at different transverse planes along the direction of wave travel, z. Within a wavelength of wave travel, the electric field varies between purely radial and purely azimuthal. The azimuthal electric field varies between being anticlockwise at one plane while being clockwise one-half wavelength away. With this understanding, it is found that the wave can be efficiently excited in this mode with an antenna that has a single loop located in a plane perpendicular to the magnetic field generating a spectrum of wave numbers such that a portion of the spectrum generated includes $2\pi/k_z$, where $k_z$ is given by the stated dispersion relation. The mode structure of the wave electric field for an m=1 mode imparts a natural helical pitch to the electric and magnetic field vectors as the wave propagates along the z direction. The electric field vector rotates in a right-handed sense, i.e., it rotates clockwise as it travels along $B_0$ which is in the z direction. This mode can be excited with the present invention if the single loop is canted at an angle to the magnetic field such that the wave spectrum generated contains a significant portion around $2\pi/k_z$ where $k_z$ is given from the dispersion relations.

The efficiency of plasma production depends on the coupling of RF energy into the plasma. As discussed above the important mechanism for damping of the RF energy is believed to be Landau damping. The phase velocity of the whistler wave is given by $\omega/k_z$, where $k_z$ is given by the dispersion relation and depends on the plasma density and magnetic field strength without plasma. Ideally the phase velocity of the wave should be near the maximum of the ionization potential of the gas we wish to ionize. From the above dispersion relation for the m=0 mode:

$$n = \alpha B_0 k_z (T^2 + k_z^2)^{\frac{1}{2}}$$

where $\alpha = B_0 k_z^2$ for $T < k_z$.

In other words, the higher the value of $k_z$, the higher the density. However, the phase velocity of the wave is $\omega/k_z$ and so increasing $k_z$, decreases the energy of the electrons that are accelerated by the wave. If the $k_z$ is too high then the energy of the electrons may fall below the ionization potential. It is therefore important to control $k_z$ in order to be able to increase the density and control the electron temperature.

The present invention uses low frequency whistler waves to generate plasmas with high density exceeding $10^{13}$ per cm$^3$. The first use of whistler waves to generate dense plasmas was described by Boswell, who used an antenna arrangement having current flows along the axis of the cylinder. This antenna configuration had been used and previously described by Ovchinnikov and excites the m=1 mode due to the current flow in conductors running parallel to the direction of the magnetic field $B_0$. The frequency of excitation was 8 mHz, and the density profile of the 10 cm plasma was found to be quite peaked, particularly at the higher magnetic field strengths needed for high densities. In these publications the mechanism for efficient coupling of the RF energy to the plasma could not be explained. Chen, in an Australian National University report, explained the mechanism as Landau damping.

Chen, in a paper presented in August 1988, described a system using whistler waves to generate dense plasmas for use in advanced particle accelerators. The type of antenna used in this arrangement was similar to that used by Boswell in that it excited the m=1 mode and was of a type known as the Nagoya Type III antenna, having circular end loops at spaced apart conditions excited with opposite phase signals.

A number of variables can be utilized once it is recognized that the single loop antenna in accordance with the present invention efficiently establishes a high density plasma. The Z axis wave number, $k_z$, varies as the ratio n/B, and inversely with wavelength $\lambda$, requiring a longer source tube. Conversely if B is decreased, the plasma density is relatively higher because the shorter wavelengths function to create needed wave numbers regardless of tube size.

The results of the present approach are best evident from study of different process units as described below.

Figure 2:
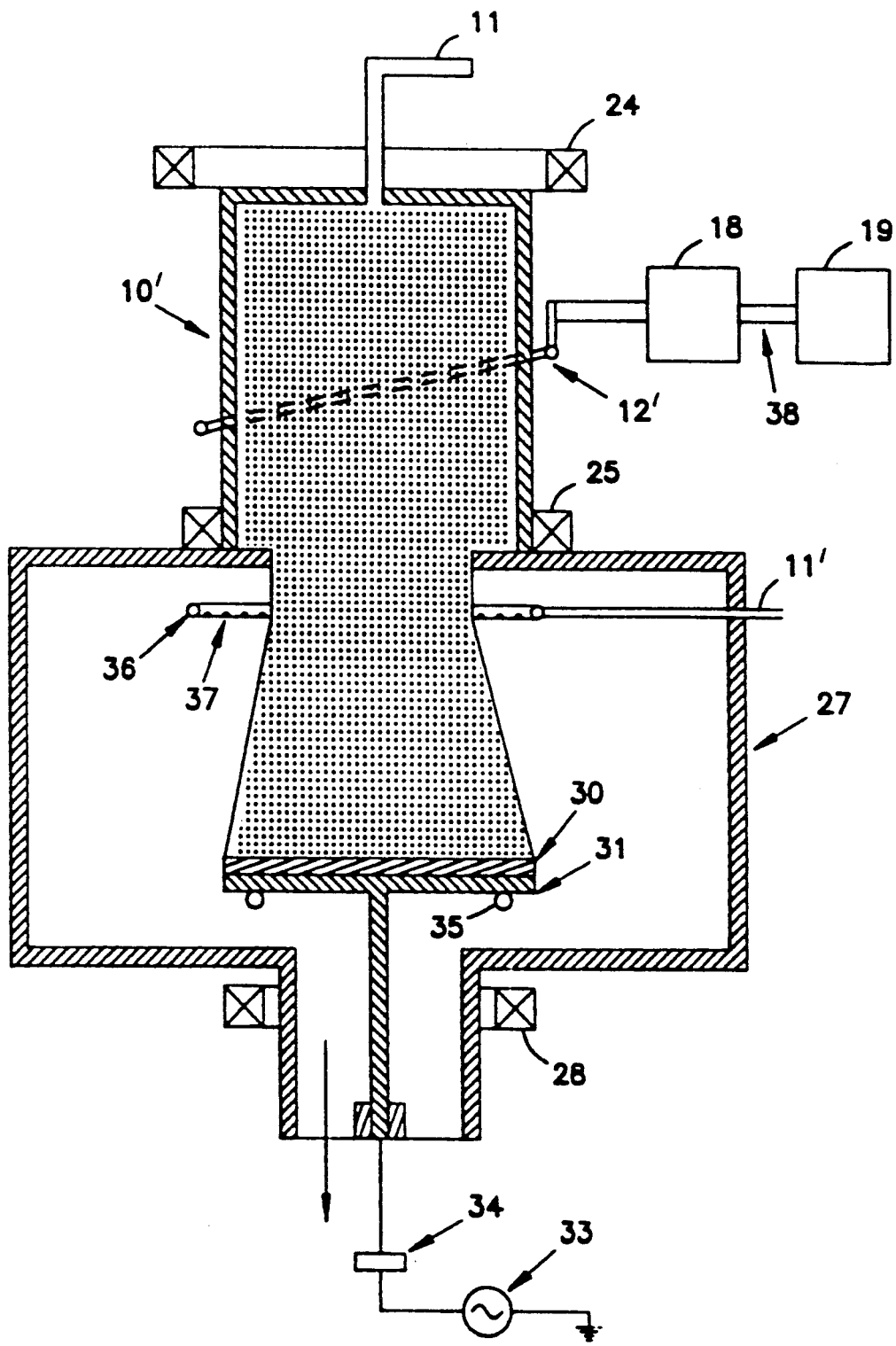
FIG. 2 is a schematic diagram of the basic configuration of a plasma deposition or etching apparatus in combination with a plasma source as in FIG. 1.

The basic configuration of a plasma deposition or etching apparatus according to the present invention is shown in FIG. 2. The plasma generation chamber 10' is cylindrical in shape and is made of a non-conducting material such as quartz or pyrex. The antenna 12' is mounted at an inclination to the longitudinal axis of the chamber 10' as described in conjunction with FIG. 1. An axial magnetic field is provided by magnetic field coils 24 and 25 as shown in FIG. 2, but the plasma can also operate using only one of these coils.

The plasma is transported by the magnetic field to a separate process chamber 27. The shape of the plasma emerging into the process chamber 27 can be controlled by varying the amount and direction of the current made to flow in a coil 28 about the exit of the chamber 27. A substrate 30 to be coated or etched is mounted on a substrate holder 31 which is electrically isolated. Plasma that bombards the substrate 30 causes the substrate 30 to reach a negative self bias of between 0 and 10 V. For some films to be formed it is advantageous for the film to be bombarded by ions with greater energy than they would obtain due to the self-bias. In this case it is desirable to apply RF power from a second RF source 33 through a second matching circuit 34. The substrate holder 31 is a copper block that is cooled or heated by a heating/cooling circuit 35. Gas is injected via a stainless steel injection tube 11 connected to the source for the plasma generation chamber 10'. A stainless steel ring 36 has a diameter that is large compared to the size of holes 37 that are distributed equally around the ring 36. This arrangement is such that a uniform flow of gas is directed towards the substrate 30. The RF voltage is applied to the antenna 12' by means of a matching circuit 18 and RF source 19, as described in conjunction with FIG. 1. Tuning in the matching circuit 18 is used to maximize the power that is coupled into the plasma and minimize the power that is reflected back along a 50 ohm cable 38 to the RF power supply 19.

FIG. 3 shows an arrangement where high uniformity over a large area is required. The plasma generation chamber 10' is cylindrical in shape and is made of a non-conducting material such as quartz or pyrex. The antenna 12' is mounted at an angle less than the perpendicular but otherwise corresponds to the configuration described in FIG. 1. An axial magnetic field is provided by the magnetic field coils 24 and 25. The plasma is transported by the magnetic field to a process volume comprising a part of a magnetic bucket chamber 40.

In a paper by Limpaecher and MacKenzie (R. Limpaecher and K. R. MacKenzie, *Rev. Sci. Instrum.* 44,726 (1973)), it is disclosed that using magnets in a peripheral multicusp arrangement can provide very uniform plasma parameters in a central zone of the volume enclosed by the magnets. The arrangement of the magnets around the circumference of a cylinder is a common arrangement used for ion sources and is referred to as a magnetic bucket. It is important to design the magnetic field in such a way that there is a good match between the axial field provided by the lower magnetic field coil 25 and the field in the magnetic bucket 40. The plasma from the generator 10' diffuses along the magnetic field lines and expands to fill the bucket 40. The wall 41 for the magnetic bucket 40 is made of stainless steel and can be of, for example, circular or rectangular cross-section. In either case the interior dimensions of the magnetic bucket 40 are such that it is larger than the interior diameter of the plasma generator 10'. The magnetic field within the bucket is provided by a number of permanent magnets 43 arranged with their poles perpendicular to the wall 41 of the bucket chamber and with alternating north N and south S poles.

With this arrangement, the magnetic field lines 44 follow a multicusp pattern, the field pattern provided by the magnets being as is shown in FIG. 3A. Referring again to FIG. 3, a substrate 45 to be coated or etched is mounted on a substrate holder 46 at the lower region of the plasma field in the magnetic bucket. The substrate holder is a copper block that is cooled or heated by a heating/cooling circuit 47. As in the system of FIG. 2, gas is injected via stainless steel tube 11' connected to the gas source for the plasma generation chamber 10'; and into the magnetic bucket 40 via a stainless steel ring 36 that is connected to the gas feed and includes small diameter holes 37 that are distributed equally around the ring 36. A uniform flow of plasma is directed towards the substrate 45, as an RF voltage from a power supply 19 is applied to the antenna 12' by means of a matching circuit 18 which consists of two vacuum capacitors as described in FIG. 1.

Figure 4:
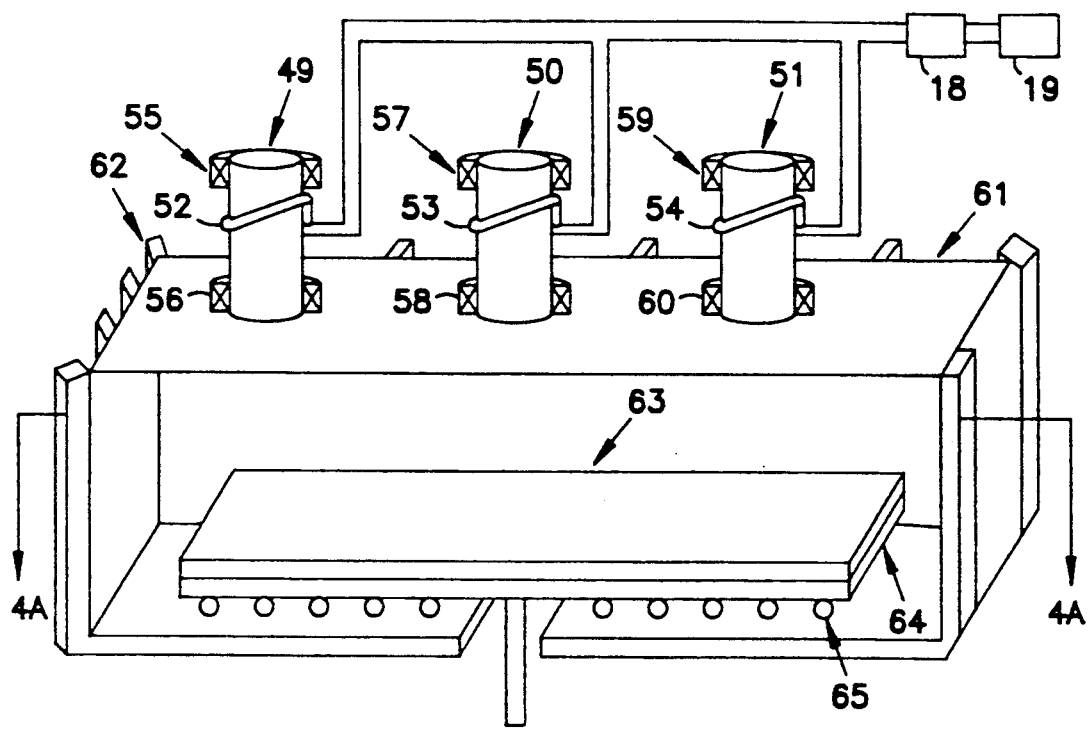
FIG. 4 is a perspective view of a third example of a system in the present invention for deposition or etching over a large rectangular area where uniformity is important.
Figure 4A:
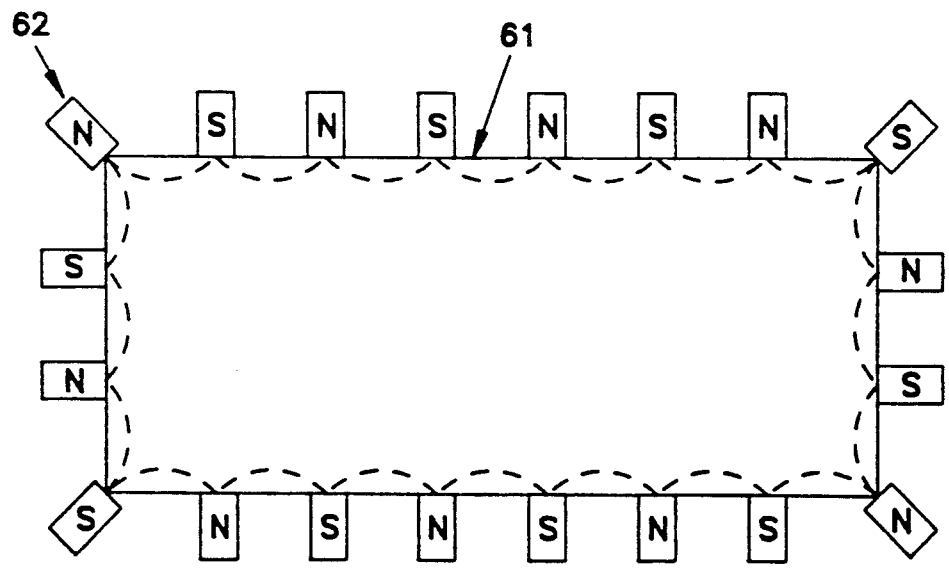
FIG. 4A is a plan view of the arrangement of FIG. 4, taken along the line 4A—4A in FIG. 4.

FIG. 4 shows an arrangement where high uniformity over large rectangular shaped areas is required such as needed in the coating of large flat displays. The plasma generator units are of the type described above but in this arrangement, multiple generators may be used depending on the size and shape of the plasma needed. In FIG. 4 three plasma generators 49, 50 and 51 are shown, disposed along the central axis of the top of a process chamber. Each plasma generation chamber is cylindrical in shape and made of non-conducting material such as quartz or pyrex, and each includes a separate single loop antenna 52, 53 or 54 of the type described in FIG. 1. However, to assure that uniform plasmas are generated, the antennas 52, 53, 54 are coupled in electrical series to the matching box 18 and RF power supply, so that equal RF current flows are assured. An axial magnetic field for each generator is provided by magnetic field coils 55, 56, 57, 58, 59, and 60. The plasmas thus separately generated are transported by the magnetic field into a common rectangular magnetic bucket chamber 61. The plasmas diffuse along the field lines and expand to fill the bucket 61. The magnetic field within the bucket chamber 61 is provided by permanent magnets 62 arranged with their poles perpendicular to the surface of the bucket chamber and with alternating N and S poles. The magnetic field pattern provided by the magnets is shown in FIG. 4A. The substrate 63 to be coated or etched is mounted on a substrate holder 64 which is electrically isolated. Plasma that bombards the substrate causes the substrate to reach a negative self bias of between 0 and 10 V. For some films to be formed or in some etching applications it is advantageous for the substrate 63 to be bombarded with energetic ions. In this case it is desirable to apply RF power from a second RF power supply (not shown) through a matching circuit to the substrate holder 64, which again may be a copper block that is cooled or heated by a heating/cooling circuit 65.

Figure 5:
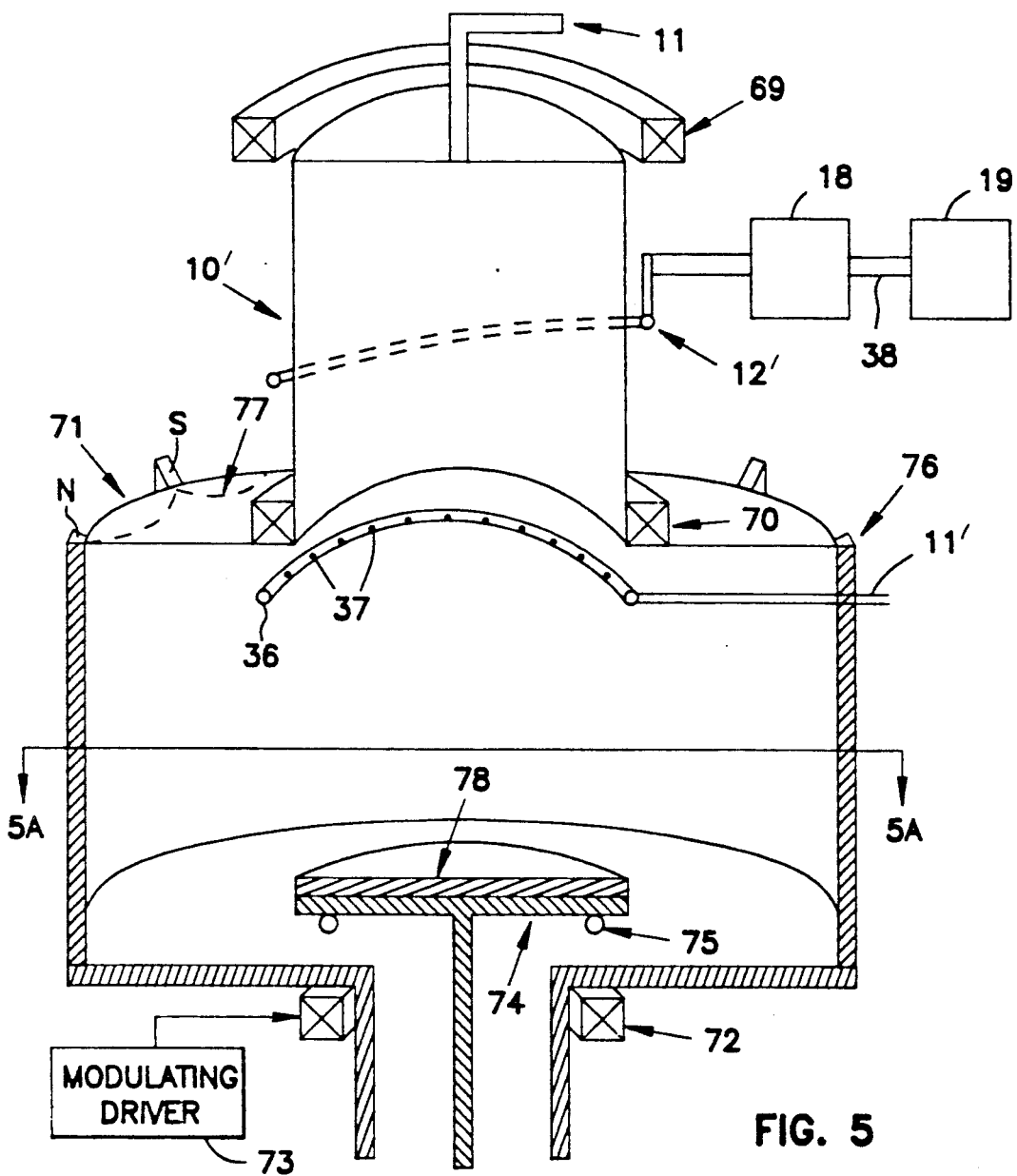
FIG. 5 is a schematic diagram of yet another example of a system in accordance with the present invention in which a bottom magnet is added behind the plane of the substrate holder to provide a magnetic cusp field, the plane of the cusp being approximately the same as the plane of the substrate holder.
Figure 5A:
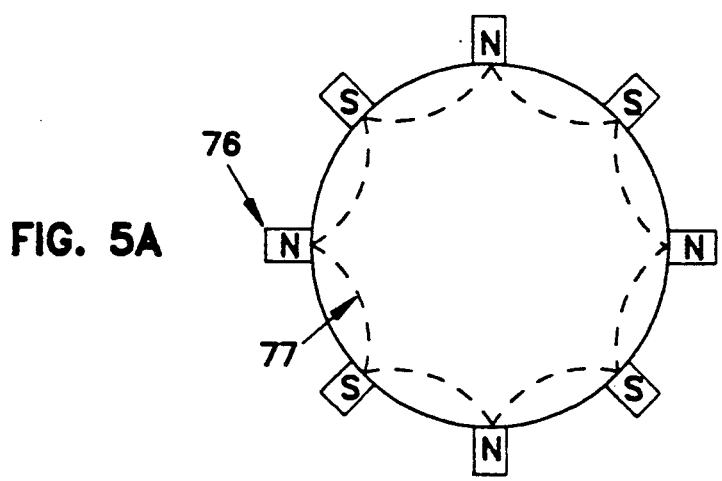
FIG. 5A is a plan view of the arrangement of FIG. 5, taken along the line 5A—5A in FIG. 5.

FIG. 5 is another example of a device in accordance with the invention, for providing additional control of plasma uniformity over a large area. The plasma generating chamber 10' is cylindrical in shape, of non-conducting material such as quartz or pyrex, and surrounded by an antenna 12' at an angle less than 90°. An axial field is provided in the source region by the magnetic field coils 69 and 70 or by only one such coil. The plasma is transported by the magnetic field to a magnetic bucket chamber 71 which is substantially of the same design as described for FIG. 3. To enhance uniformity and to ease the transition of plasma into the bucket chamber 71, an additional magnetic field coil 72 concentric with the central axis of the plasma generating chamber 10' is located below the substrate holder 74 which is cooled or heated by a heating/cooling circuit 75. The permanent magnets 76 about the bucket chamber 71 are arranged as described earlier in FIG. 2 and create a magnetic cusp field 77 as seen in FIG. 5A. The current in the additional magnetic field coil 72 is made to carry a current in the direction opposite to that of the currents made to flow in coils 69 and 70. The effect is to create another magnetic cusp, now a ring cusp, located approximately in the plane of the substrate 78, such plane being substantially perpendicular to the line cusps created by the North-South permanent magnets 76.

Gas is injected as above by an injection port 11 into the plasma generator 10' and by another feed tube 11' into a stainless steel ring 36 into the bucket chamber 71. The ring 36 has a diameter large compared to the size of holes 37 directing a uniform flow of gas to the substrate 78. The ring 36 can also be the gas feed for the source when the main feed is not used. Small amplitude variations with time in the current flowing in the coil 72 are generated by a modulating driver 73 to cause the ring cusp plane to fluctuate up and down about the plane of the substrate 78, thereby time-averaging the plasma profile incident across the substrate and further enhancing uniformity. This approach of using the time-variation of a bottom coil can also be employed to enhance uniformity when a magnetic bucket is not employed by using the arrangement shown in FIG. 2 and by running the current in coil 28 in the exit region therein opposite to that in coils 24 and 25 at the plasma generation chamber 10', thereby creating the ring cusp in the plane of the substrate as just described.

Figure 6:
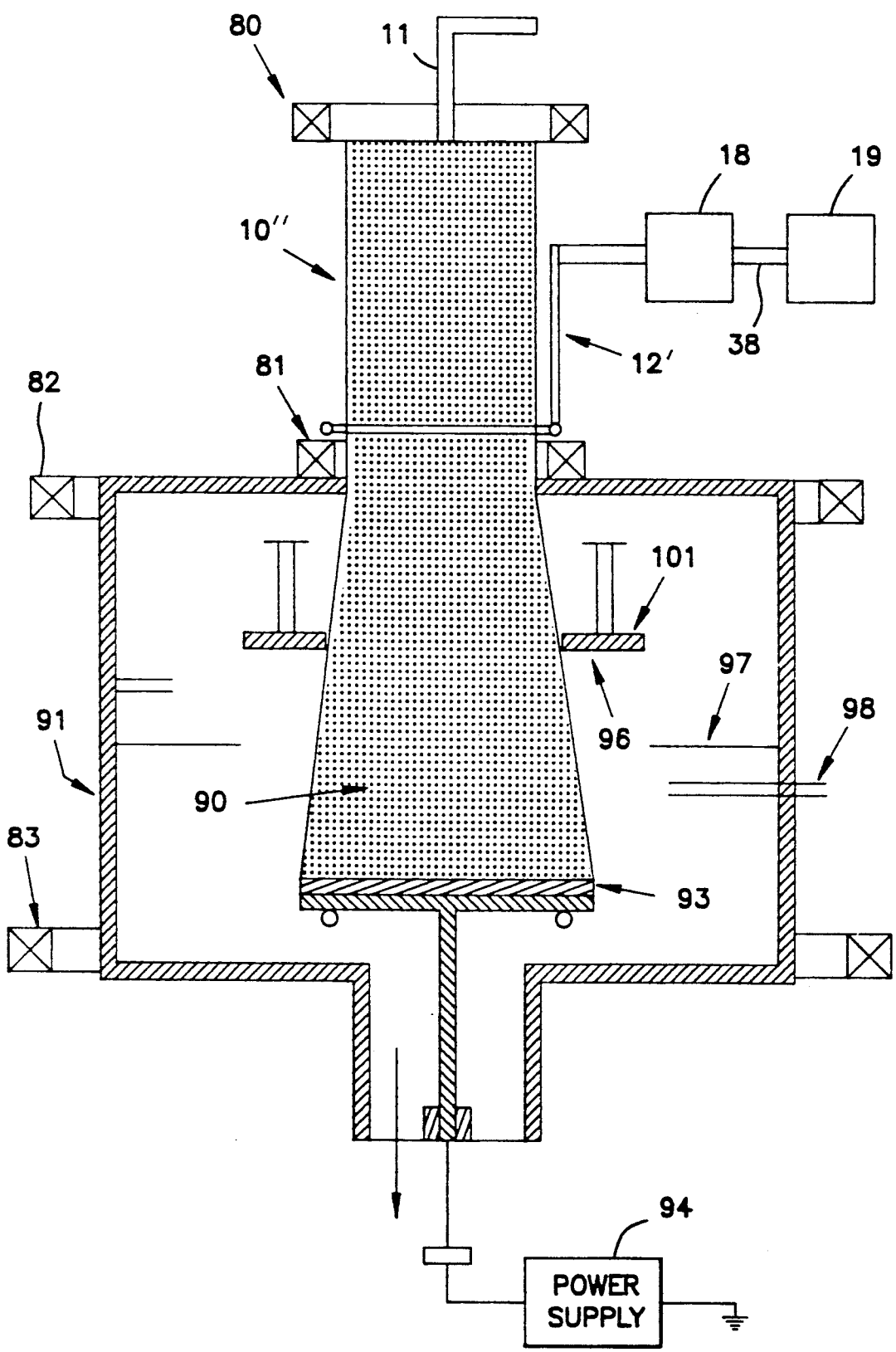
FIG. 6 is a schematic diagram of an example of a system in accordance with the invention for sputter deposition.

FIG. 6 is another exemplification according to the present invention that is suitable for using the RF generator system in conjunction with a sputter target. The plasma generator chamber 10" is cylindrical in shape, of non-conducting material, and surrounded by an antenna 12' mounted in a plane perpendicular to the longitudinal axis. as in the example of FIG. 1. An axial magnetic field is provided by the magnetic field coils 80 and 81 about the chamber 10" and 82 and 83 about a process chamber 91. The plasma 90 is transported from the plasma generator 10" into the process chamber 91 and flows along the magnetic field to a lowermost sputter target 93 which is biased to a large negative voltage (about $-700$ V) by a power supply 94. A DC power supply is 25 used to maintain a charge when the substrate holder is conductive, but if the substrate holder is non-conductive an alternating current power supply is employed instead. The plasma diameter is made to conform to that of the target by controlling the magnetic field. The material sputtered from the target 93 is deposited on the substrates 96 juxtaposed about it. A horizontal baffle 97 in a plane above the target 93 may be used to control the gas pressure near the substrate and other gases may be introduced near the substrate through outlet 98. The substrates 96 are mounted on a substrate holder 101 and are positioned above the sputter target. The substrate holder 101 can rotate about the vertical axis to enhance uniformity of deposition of sputtered material. The substrate holder 101 has a central aperture to permit plasma to pass along the magnetic field from the plasma generator 10" to the sputter target 93.

Figure 7:
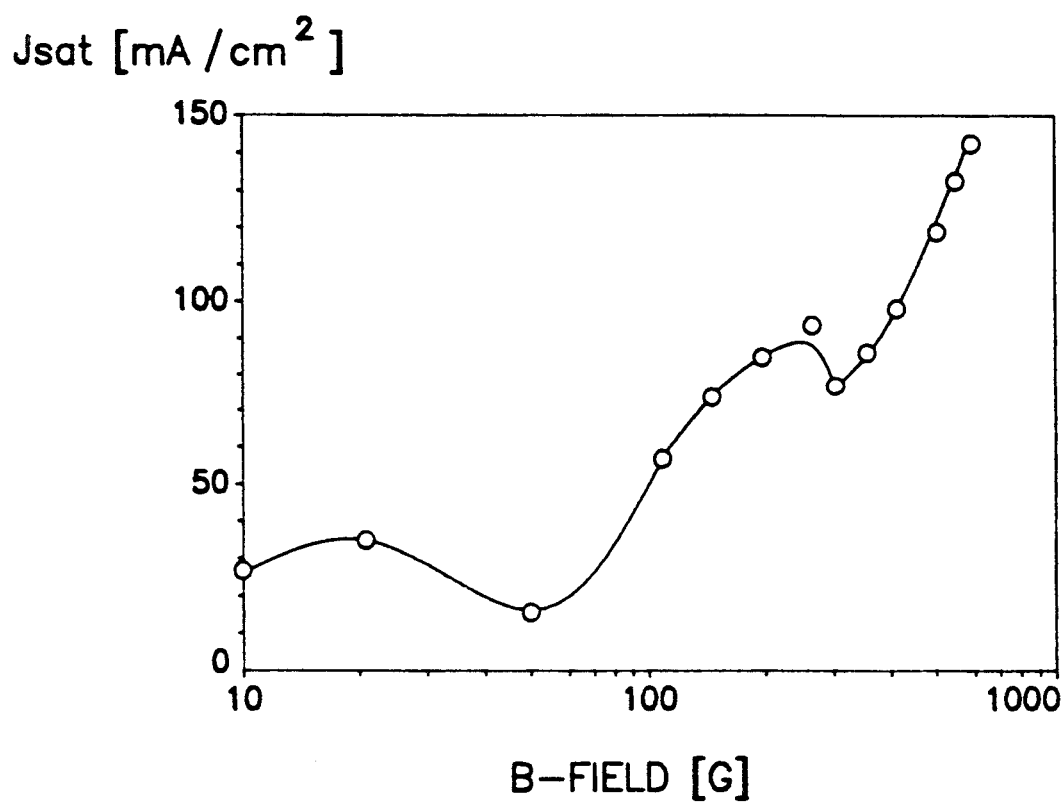
FIG. 7 is a graph depicting the plasma current density at the substrate location according to the example of FIG. 3 using the plasma source depicted in FIG. 1 as a function of magnetic field in the source region.
Figure 8:
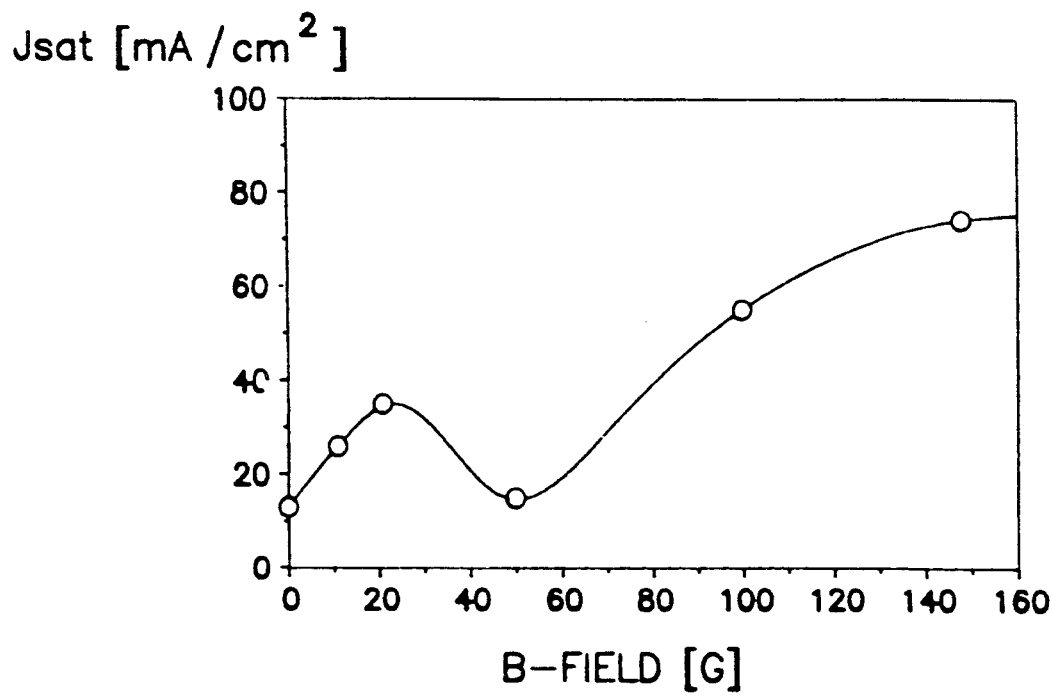
FIG. 8 is a graph of the same data as in FIG. 7 but graphed on a linear scale for magnetic field to show the plasma current density at the substrate location where the magnetic field is low, varying from zero to 160 gauss.

Data are shown in FIG. 7 on the plasma current density measured mA/cm$^2$ produced according to the present invention in the arrangement shown in FIG. 3 using the antenna shown in FIG. 1 and measured by using a fast-injection Langmuir probe at a location just above the plane of the substrate. The RF frequency was 13.56 MHz and was supplied using a commercial RF power supply generating 2.0 KW passing through a matching box as shown in FIG. 1. Data was obtained for the plasma current density as a function of magnetic field in the source chamber 10' from zero to 1000 gauss. The data for field varying from zero to 160 gauss is shown in FIG. 8. The gas pressure is about 1 mtorr. A substantial current density approaching 40 mA/cm$^2$ is found at a low value of field equal to 20 gauss. Increase of the magnetic field to 100 gauss and above also produces high values of plasma current density, achieving levels of 140 mA/cm$^2$. These data establish that resonances exist at low field values to give surprisingly high and novel plasma current densities. Resonances again arise, in monotonically increasing relation to field strength, after an intermediate range in which current densities are lower.

Figure 9:
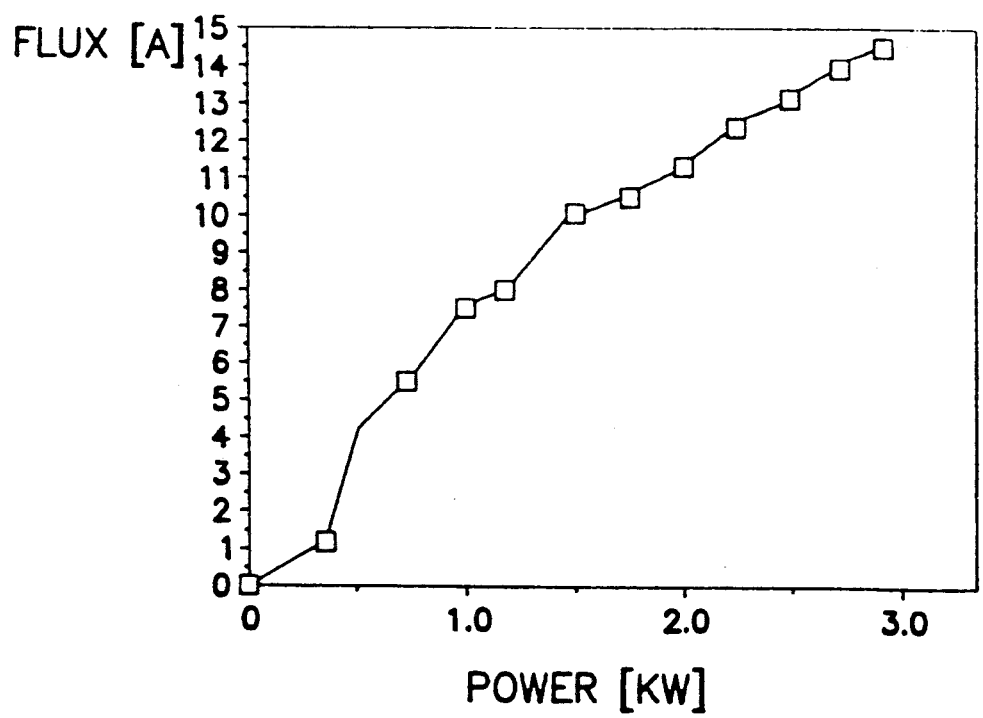
FIG. 9 is a graph depicting the total plasma current (or total flux) at the substrate location according to the invention as depicted in FIG. 3 using the plasma source as depicted in FIG. 1 as a function of RF power to the source at a gas pressure of 2 mtorr.

In FIG. 9, data are shown for the total plasma flux measured in Amperes reaching the substrate plane as a function of RF power for a gas pressure of 2 mtorr and a magnetic field in the source chamber of 250 gauss. The total flux achieved is over a diameter of 8 inches (20 cm). The total flux incident onto the substrate reaches as high as 15 Amperes from a source with a chamber diameter of about 4" (10 cm).

Figure 10:
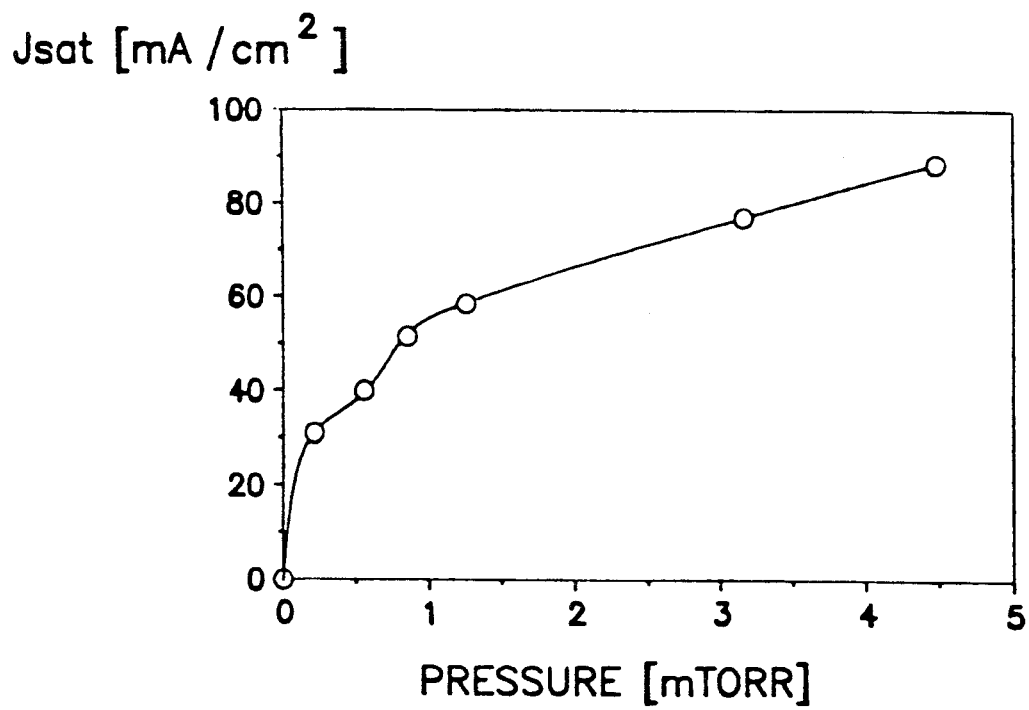
FIG. 10 is a graph depicting the plasma current density at the substrate location according to the invention as depicted in FIG. 3 using the antenna as depicted in FIG. 1 as a function of the gas pressure.

FIG. 10 depicts operation of the plasma source in the arrangement described in FIG. 3 with the antenna as described in FIG. 1 as a function of gas pressure in the chamber, demonstrating that the source operates effectively at low pressures (below 1 mtorr) up to higher pressures. The source has been run successfully at pressures greater than 100 mtorr.

Figure 11:
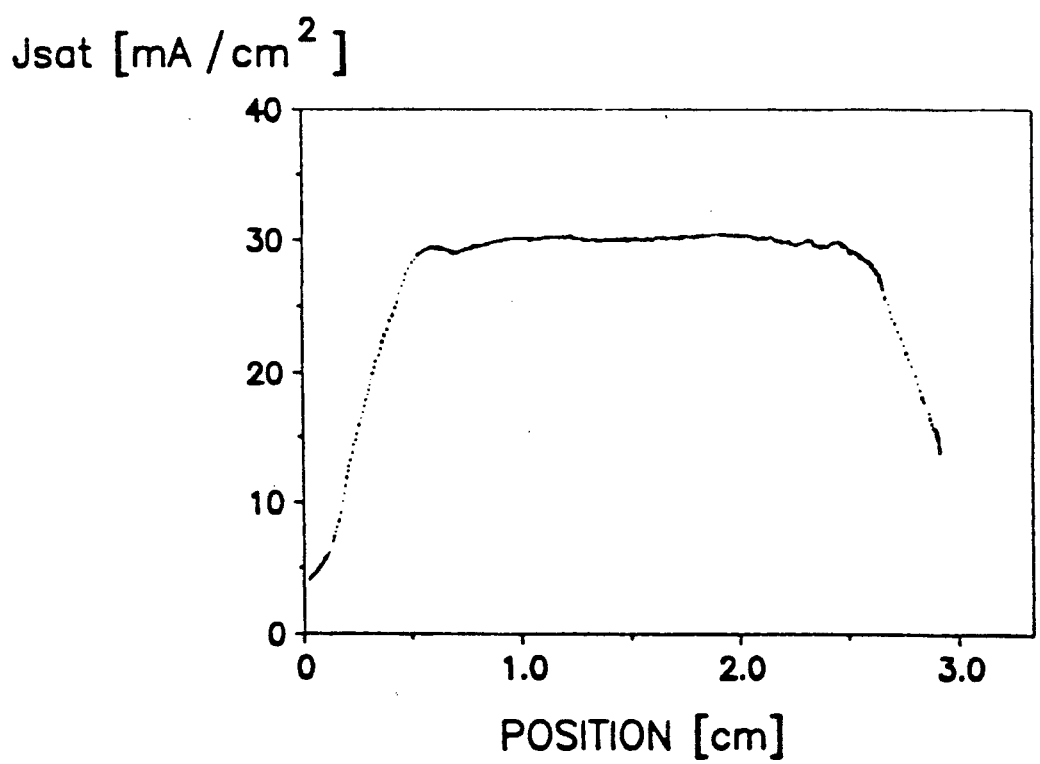
FIG. 11 is a graph depicting the plasma current density at the substrate location according to the invention as depicted in FIG. 3 and the plasma source of FIG. 1 as a function of position to show the excellent uniformity over a substantial width.

The uniformity of the plasma is shown in FIG. 11, said uniformity measured at a distance 6" below the exit of the source chamber 10' in the bucket chamber 40 with a substrate 45 in place using the arrangement shown in FIG. 3 and the antenna as depicted in FIG. 1. The magnetic field in the source chamber 10' is 150 gauss and the pressure is about 2 mtorr. The plasma is highly uniform over a width exceeding 8" (20 cm). A similar degree of uniformity is achieved using the cusp magnetic arrangement depicted in FIG. 5, employing the magnetic coil 72 carrying a current in a direction opposite to the current flowing in the magnetic field coils 69 and 70.

Consequently it will be appreciated that systems and devices in accordance with the invention provide uniform plasmas utilizing low frequency whistler wave excitations using a single loop antenna with a source chamber. By interaction with the plasma load under an appropriate magnetic field condition and with selected RF power an extended plasma in a process chamber can cover a wide area of shaped areal characteristic, if desired, with high plasma current density and high total plasma flux. Both low and high magnetic field strength modes are sustainable, and etching, deposition and sputtering processes can be employed.

While the invention has been described relative to a number of forms and variations, it will be appreciated that the invention is not limited thereto but encompasses all modifications in accordance with the scope of the appended claims.

What is claimed is:

1. A system for generating a high density plasma comprising:
   a plasma confinement chamber of cylindrical form;
   means for injecting a gas to be ionized into the chamber;
   antenna means comprising a single loop element encompassing the cylindrical chamber, the loop element being disposed in a plane at an angle of in excess of 45° to the central axis of the chamber, and positioned in an intermediate region along the length of the chamber;
   means disposed adjacent the chamber and the antenna means for generating a longitudinal magnetic field in the chamber; and means coupled to the antenna means for exciting the loop element with radio frequency energy.

2. A system as set forth in claim 1 above, wherein the magnetic field is less than 1000 gauss, the plasma density is in excess of $10^{13}/cm^3$, and the loop element is at an angle of about 90° relative to the magnetic field.

3. A system as set forth in claim 2 above, wherein the system has a first plasma current and density peak in the range of about 50 gauss and a second plasma and density peak in the range of about 400 gauss.

4. A system as set forth in claim 3 above, wherein the radio frequency energy is in the range of 13.56 MHz and the means for exciting further includes impedance matching means.

5. A system as set forth in claim 1 above, wherein the mode structure of the wave electric field imparted by the loop element is the m-0 node and has a pitch of $2\pi/k_z$, where $k_z$ is determined by the dispersion relation, $[\omega/\omega_c - \omega_p^2/C^2k_z^2]^2 = 1 + (3.83\ k_z a)^2$ and a phase velocity of $\omega/k_z$, where $\omega$ is the frequency of excitation, $\omega_c$ is the electron cyclotron angular frequency, $\omega_p$ is the plasma frequency, $k_z$ is the axial wave number in the plasma and a is the plasma radius.

6. A system as set forth in claim 5 above, wherein the plasma is excited with low frequency whistler waves having the relation $\Omega_c < \omega < \omega_c$, wherein $\Omega_c$ is the ion cyclotron frequency.

7. A system as set forth in claim 6 above, wherein the plasma density is in excess of $10^{13}/cm^3$, and the chamber is a non-magnetic insulating chamber.

8. A system as set forth in claim 1 above, wherein the cylindrical chamber includes an exit aperture along the longitudinal axis, and the system further includes a process chamber adjacent the cylindrical chamber and in communication with the cylindrical chamber via the exit aperture and means for supporting an element to be processed therein, and wherein the process chamber has a greater cross-sectional area than cylindrical chamber.

9. A system as set forth in claim 8 above, wherein the process chamber includes means for maintaining a plasma therein.

10. A system as set forth in claim 9 above, wherein the means for maintaining a plasma comprises magnetic means about the process chamber for defining a magnetic bucket chamber.

11. A system as set forth in claim 10 above, wherein the magnetic bucket chamber is rectangular in plan and wherein the system comprises at least two plasma confinement chambers having associated single loop antenna elements thereabout, and disposed along the magnetic bucket chamber.

12. A system as set forth in claim 8 above, wherein the system comprises at least two plasma confinement chambers, each having an associated single loop antenna thereabout, and circuit means coupling the antennas in series for exciting the antennas with radio frequency energy.

13. A system as set forth in claim 8 above, wherein the system further comprises means for maintaining a substrate to be processed in the path of the plasma in the process chamber.

14. A system as set forth in claim 13 above, wherein the system further includes means for maintaining a magnetic cusp field in the region of the substrate, the magnetic cusp field opposing the longitudinal magnetic field in the chamber.

15. A system as set forth in claim 14 above, wherein the means for maintaining a magnetic cusp field comprises means for varying the intensity of the magnetic cusp field to time average the plasma flux density at the substrate.

16. A system as set forth in claim 8 above, wherein the system comprises a sputter target and a sputter target holder in the process chamber in the path of the plasma, means for biasing the sputter target holder, and substrate means about the plasma path between the cylindrical chamber and the sputter target, in the path of material sputtered therefrom.

17. A plasma processing apparatus for processing a substrate, comprising:
(a) an antenna radiating electromagnetic waves in the RF range of frequencies, consisting of single current loop located outside but surrounding closely a plasma generating chamber;
(b) a cylindrical plasma generation chamber, the plasma generation chamber being proximate to and in electromagnetic communication with the antenna, such that the longitudinal axis of the cylindrical plasma generation chamber and the plane of the current loop are either perpendicular or at an angle less than 90°;
(c) a first fluid injector, the first fluid injector introducing a fluid into the plasma generation chamber, thereby permitting the creation of a plasma within the plasma generation chamber;
(d) a magnetic field generator, the magnetic field generator generating a magnetic field substantially parallel to the longitudinal axis of the plasma generation chamber;
(e) a process chamber, the plasma being transported to the process chamber by the magnetic field;
(f) a second fluid injector, the second fluid injector introducing a fluid into the process chamber;
(g) a current controller, the current controller controlling the current within the magnetic field generator, thereby controlling plasma shape;
(h) a substrate holder, the substrate holder residing within the process chamber; and
(i) a substrate, the substrate being mounted on the substrate holder, the substrate thereby being subjected to the plasma.

18. An apparatus as set forth in claim 17 above, further including:
(j) an auxiliary radio frequency generator for applying radio frequency power to a substrate residing on the substrate holder;
(k) a radio frequency exciter, the radio frequency exciter generating a radio frequency voltage and current; and
(l) a matching network, the matching network interconnecting the radio frequency exciter and the antenna, thereby promoting the efficient transfer of radio frequency energy from the radio frequency exciter to the antenna.

19. The plasma processing apparatus of claim 17, wherein the substrate holder is supported within the process chamber in a state of substantial electrical insulation.

20. The plasma processing apparatus of claim 20, wherein the substrate holder comprises:
(a) a copper block and
(b) thermal control means, permitting temperature regulation of the copper block.

21. The plasma processing apparatus of claim 20, wherein the second fluid injector is formed as a porous element, thereby permitting a gas to be introduced within the element, the gas escaping from the element into the process chamber.

22. The plasma processing apparatus of claim 21, wherein the porous element is formed as a ring, the ring being constructed of tubing, the tubing being perforated so as to permit the gas to escape from the ring into the process chamber.

23. The plasma processing apparatus of claim 22, wherein the plasma generation chamber is a quartz cylinder.

24. The plasma processing apparatus of claim 17, further comprising a plurality of magnets, the magnets being arranged in a circumferential manner proximate to the process chamber, succeeding magnets having opposite orientations of north and south poles.

25. The plasma processing apparatus of claim 24, wherein the process chamber has a cross sectional area that is larger than a cross section of the plasma generation chamber.

26. The plasma processing apparatus of claim 25, wherein the process chamber is formed substantially of stainless steel.

27. The plasma process apparatus of claim 26, wherein the cross section of the process chamber is a regular geometric shape.

28. The plasma processing apparatus of claim 24, further comprising an additional magnetic field generator, said generator being located behind the substrate holder on the side of the substrate that is opposite to that of the plasma generating chamber and being located in a plane substantially parallel to that of the other magnetic field generator, and which generates a magnetic field opposed to that of the other magnetic field generator.

29. The plasma processing apparatus of claim 28 in which the magnetic field generator located behind the substrate holder generates a time-varying magnetic field.

30. The plasma processing apparatus of claim 17, further comprising an additional magnetic field generator, said generator being located behind the substrate holder on the side of the substrate that is opposite to that of the plasma generating chamber and being located in a plane substantially parallel to that of the other magnetic field generator, and which generates a magnetic field opposed to that of the other magnetic field generator.

31. The plasma processing apparatus of claim 30 in which the magnetic field generator located behind the substrate holder generates a time-varying magnetic field.

32. A plasma processing apparatus according to claim 17 for sputter deposition, comprising:
   (a) at least one target;
   (b) biasing means, the biasing means applying a voltage to the target, thereby causing ions of the plasma to bombard the target and causing material from the target to be deposited on the substrate.

33. The plasma processing apparatus of claim 17, further comprising:
   (a) a plurality of plasma generation chambers, each plasma generation chamber being cooperatively connected to the processing chamber;
   (b) a plurality of antennas, each antenna being electromagnetically coupled to each plasma generation chamber; and
   (c) a plurality of magnetic field generators, each magnetic field generator being magnetically coupled to each plasma generation chamber.

34. The plasma processing apparatus of claim 17, further comprising:
   (a) a plurality of plasma generation chambers, each plasma generation chamber being cooperatively connected to the process chamber, each plasma generation chamber being coaxial to the longitudinal axis of the plasma generator chamber;
   (b) a plurality of antennas, each antenna being electromagnetically coupled to a respective plasma generation chamber;
   (c) a plurality of magnetic field coils, the magnetic field coil being proximate to the process chamber;
   (d) a plurality of magnetic field generators, each magnetic field generator being magnetically coupled to each plasma generator; and
   (e) a plurality of substrate holders mounted within the process chamber.

* * * * *

UNITED STATES PATENT AND TRADEMARK OFFICE
CERTIFICATE OF CORRECTION

PATENT NO. : 5,122,251
DATED : June 16, 1992
INVENTOR(S) : Gregor A. Campbell et al.

It is certified that error appears in the above-identified patent and that said Letters Patent is hereby corrected as shown below:

In the Abstract, line 3, after "loop" insert --antenna--. Column 6, line 50, after "important" insert --to--. Column 11, line 36, after "is" strike "25"; Column 13, line 17, "node" should read --mode --.

Signed and Sealed this

Eighth Day of February, 1994

Attest:

BRUCE LEHMAN

Attesting Officer   Commissioner of Patents and Trademarks